US012689399B2

(12) United States Patent
Krenn et al.

(10) Patent No.: US 12,689,399 B2
(45) Date of Patent: Jul. 21, 2026

(54) NFC DEVICE AND METHOD OF OPERATING THE SAME

(71) Applicant: NXP B.V., Eindhoven (NL)

(72) Inventors: Adrian Rafael Krenn, St. Bartholomä (AT); Rahul Nadgouda, Graz (AT); Erich Merlin, Gratkorn (AT); Martin Buchsbaum, Graz (AT)

(73) Assignee: NXP B.V., Eindhoven (NL)

( * ) Notice: Subject to any disclaimer, the term of this patent is extended or adjusted under 35 U.S.C. 154(b) by 480 days.

(21) Appl. No.: 18/321,078

(22) Filed: May 22, 2023

(65) Prior Publication Data

US 2023/0396274 A1 Dec. 7, 2023

(30) Foreign Application Priority Data

Jun. 2, 2022 (EP) ...................................... 22176969

(51) Int. Cl.
  *H04B 1/04* (2006.01)
  *H04B 5/20* (2024.01)
  *H04B 5/77* (2024.01)
  *H03H 7/38* (2006.01)
(52) U.S. Cl.
  CPC ............. *H04B 1/0458* (2013.01); *H04B 5/20* (2024.01); *H04B 5/77* (2024.01); *H03H 7/38* (2013.01)
(58) Field of Classification Search
  CPC .......... H04B 1/0458; H04B 1/04; H04B 5/00; H04B 5/20; H04B 5/77; H04B 5/0062; H04B 5/0031; H03H 7/38
  See application file for complete search history.

(56) References Cited

U.S. PATENT DOCUMENTS

| | | | |
|---|---|---|---|
| 10,237,000 B1 | 3/2019 | Buchsbaum et al. | |
| 11,005,534 B2 * | 5/2021 | Nunziata ................... | H04B 5/48 |
| 2017/0272176 A1 * | 9/2017 | Konanur .............. | H04B 13/005 |
| 2019/0074914 A1 | 3/2019 | Hueber et al. | |
| 2021/0203382 A1 | 7/2021 | Kim et al. | |

OTHER PUBLICATIONS

ISO/IEC 14443-2:2020; "Cards and Security Devices for Personal Identification—Contactless Proximity Objects—Part 2: Radio Frequency Power and Signal Interface"; Published Jul. 2020 Fourth Edition.

(Continued)

*Primary Examiner* — Tuan H Nguyen

(57) ABSTRACT

There is described a method of operating an NFC device, the method comprising: determining a resonance frequency of a matching network of the NFC device; modulating, by a modulator, a carrier signal received from an external reader, resulting in a modulated carrier signal; controlling, using a controller, a transmission of the modulated carrier signal to the external reader; and transmitting, by a transmitter driver, said modulated carrier signal, said transmitter driver having at least one configurable setting that influences a damping behavior of the transmitted modulated carrier signal, wherein, during a modulation phase of the NFC device, the controller selects and applies the at least one configurable setting based on the determined resonance frequency such that a clock synchronization window is widened. Furthermore, a corresponding NFC device is described.

20 Claims, 6 Drawing Sheets

(56) References Cited

OTHER PUBLICATIONS

ISO/IEC 18092:2013 NFCIP-1; "Information technology—
Telecommunications and Information Exchange Between Systems—
Near Field Communication—Interface and Protocol (NFCIP-1)";
Published Mar. 15, 2013 Second Edition.
NFC Forum: "Analog Technical Specification"; Version 2.1; Feb.
20, 2020.

* cited by examiner

* Ron can vary from Ron1, Ron2, ...Ronx
** The shaping of the TX signal can be adapted

NFC DEVICE AND METHOD OF OPERATING THE SAME

CROSS-REFERENCE TO RELATED APPLICATIONS

This application claims priority under 35 U.S.C. § 119 to European Patent Application No. 22176969.8, filed on Jun. 2, 2022, the contents of which are incorporated by reference herein.

TECHNICAL FIELD

The present disclosure relates to the field of NFC (Near Field Communication) technology. More specifically, the present disclosure relates to a method of operating an NFC device and to a corresponding NFC device.

ART BACKGROUND

In NFC devices operating in card emulation mode without any stable system clock or XTAL, the clock needs to be recovered from the RF field (so called clock-less configuration) of the NFC terminal which operates at 13.56 MHz. U.S. Pat. No. 11,005,534 B2 describes techniques for pre-configuring an NFC device in order to improve the clock recovery, e.g., by applying fixed settings for TX shaping, driver resistances, and phase.

However, due to production spread of electronic components and corresponding variations among individual NFC devices, the known techniques are not always sufficient to assure an effective clock recovery.

There may thus be a need for ways of improving the known techniques to be less susceptible to variations caused by component production spread.

SUMMARY

This need may be met by the subject matter according to the independent claims. Advantageous embodiments of the present disclosure are set forth in the dependent claims.

According to a first aspect, there is provided method of operating an NFC device, the method comprising: determining a resonance frequency of a matching network of the NFC device, modulating, by a modulator, a carrier signal received from an external reader, resulting in a modulated carrier signal, controlling, using a controller, a transmission of the modulated carrier signal to the external reader, and transmitting, by a transmitter driver, said modulated carrier signal, said transmitter driver having at least one configurable setting that influences a damping behavior of the transmitted modulated carrier signal, wherein, during a modulation phase of the NFC device, the controller selects and applies the at least one configurable setting based on the determined resonance frequency such that a clock synchronization window is widened.

This aspect is based on the idea that the controller selects and applies at least one configurable setting of the transmitter driver based on the determined resonance frequency of the NFC device's matching network (which depends on the electronic components of the matching network) such that the clock synchronization window is sufficiently wide to successfully recover the clock.

According to an embodiment, the at least one configurable setting is associated with a variable resistance of the transmitter driver.

In other words, the configurable setting may contain information for setting, adjusting, and/or varying the resistance of the transmitter driver and thereby influencing the damping of the transmitted modulated carrier signal correspondingly.

According to a further embodiment, the at least one configurable setting comprises a sequence of different resistances to be applied during different parts of the modulation phase of the NFC device.

In other words, the at least one configurable setting may contain information that specifies a sequence of resistance values to be applied at different times during the modulation phase.

According to a further embodiment, the at least one configurable setting comprises a phase of the transmitted modulated carrier signal.

Thereby, the phase of the transmitted modulated carrier signal may be adjusted in order to improve the damping correspondingly and thereby increase the width of the clock synchronization window.

According to a further embodiment, the at least one configurable setting comprises a TX shaping functionality to be applied during the modulation phase of the NFC device.

Here, a TX shaping functionality in dependency on the determined resonance frequency in order to improve the damping and thereby increase the width of the clock synchronization window.

According to a further embodiment, the TX shaping functionality is selected from a group consisting of no TX shaping and at least one predetermined TX shaping method.

In other words, in some cases (i.e., for a certain range of resonance frequencies) no TX shaping may be applied, while in other cases (i.e., for other ranges of the resonance frequency), predetermined TX shaping methods may be selected and applied in dependency of the resonance frequency.

According to a further embodiment, the controller selects the at least one configurable setting from a plurality of predetermined settings, each of the predetermined settings corresponding to a particular resonance frequency value.

In other words, the at least one configurable setting is selected among a number of possible settings in direct dependency on the determined resonance frequency value. If, for a certain determined resonance frequency value, a corresponding predetermined setting is not available, the setting for the resonance frequency value that is closest to the determined resonance frequency value may be selected. The settings may preferably be stored in a look-up table.

According to a further embodiment, the controller selects the at least one configurable setting by applying interpolation to at least two predetermined settings of the plurality of predetermined settings.

In particular, the controller may select one setting corresponding to a frequency value that is larger than the determined resonance frequency value and another setting corresponding to a frequency value that smaller than the determined resonance frequency value and then determine the setting to be applied by interpolation.

According to a further embodiment, determining the resonance frequency comprises sweeping a transmitter clock frequency over a predetermined frequency range, identifying a frequency value within the predetermined frequency range at which a voltage at a receiver circuit of the NFC device has a minimum value or a maximum value, and using the identified frequency value as the resonance frequency.

In other words, the resonance frequency is determined as the frequency where the voltage at the receiver circuit reaches a minimum or maximum value. If the voltage is measured at an EMC filter, the resonance frequency will correspond to a minimum voltage, whereas it will correspond to a maximum voltage if the voltage is measured directly at the antenna.

Other resonance frequency determination methods are also possible, e.g. via current, voltage, or other demodulation techniques, like IQ demodulation.

According to a further embodiment, the sweeping, identifying, and using steps are performed with the NFC device having an unloaded antenna.

In other embodiments, the steps of determining the resonance frequency may be performed with the NFC device having a loaded antenna.

According to a second aspect, there is provided an NFC device. The NFC device comprises a resonance frequency determining circuitry configured to determine a resonance frequency of a matching network of the NFC device, a modulator configured to modulate a carrier signal received from an external reader, resulting in a modulated carrier signal, a controller configured to control a transmission of the modulated carrier signal to the external reader, and a transmitter driver configured to transmit said modulated carrier signal, said transmitter driver having at least one configurable setting that influences a damping behavior of the transmitted modulated carrier signal. The controller is further configured to select and apply the at least one configurable setting based on the determined resonance frequency such that a clock synchronization window is widened.

This aspect is essentially based on the same idea as the first aspect discussed above and provides an NFC device capable of performing the method according to the first aspect to obtain the corresponding advantages as discussed above.

According to a further embodiment, the at least one configurable setting is associated with a variable resistance of the transmitter driver.

In other words, the configurable setting may contain information for setting, adjusting, and/or varying the resistance of the transmitter driver and thereby influencing the damping of the transmitted modulated carrier signal correspondingly.

According to a further embodiment, the at least one configurable setting comprises a sequence of different resistances to be applied during different parts of the modulation phase of the NFC device.

In other words, the at least one configurable setting may contain information that specifies a sequence of resistance values to be applied at different times during the modulation phase.

According to a further embodiment, the at least one configurable setting comprises a phase of the transmitted modulated carrier signal.

Thereby, the phase of the transmitted modulated carrier signal may be adjusted in order to improve the damping correspondingly and thereby increase the width of the clock synchronization window.

According to a further embodiment, the at least one configurable setting comprises a TX shaping functionality to be applied during the modulation phase of the NFC device.

Here, a TX shaping functionality in dependency on the determined resonance frequency in order to improve the damping and thereby increase the width of the clock synchronization window.

According to a further embodiment, the TX shaping functionality is selected from a group consisting of no TX shaping and at least one predetermined TX shaping method.

In other words, in some cases (i.e., for a certain range of resonance frequencies) no TX shaping may be applied, while in other cases (i.e., for other ranges of the resonance frequency), predetermined TX shaping methods may be selected and applied in dependency of the resonance frequency.

According to a further embodiment, the controller selects the at least one configurable setting from a plurality of predetermined settings, each of the predetermined settings corresponding to a particular resonance frequency value.

In other words, the at least one configurable setting is selected among a number of possible settings in direct dependency on the determined resonance frequency value. If, for a certain determined resonance frequency value, a corresponding predetermined setting is not available, the setting for the resonance frequency value that is closest to the determined resonance frequency value may be selected. The settings may preferably be stored in a look-up table.

According to a further embodiment, the controller selects the at least one configurable setting by applying interpolation to at least two predetermined settings of the plurality of predetermined settings.

In particular, the controller may select one setting corresponding to a frequency value that is larger than the determined resonance frequency value and another setting corresponding to a frequency value that smaller than the determined resonance frequency value and then determine the setting to be applied by interpolation.

According to a further embodiment, the resonance frequency determining circuitry is configured to sweep a transmitter clock frequency over a predetermined frequency range, identify a frequency value within the predetermined frequency range at which a voltage at a receiver circuit of the NFC device has a minimum value or a maximum value, and use the identified frequency value as the resonance frequency.

In other words, the resonance frequency determining circuitry determines the resonance frequency as the frequency where the voltage at the receiver circuit reaches a minimum or maximum value. If the voltage is measured at an EMC filter, the resonance frequency will correspond to a minimum voltage, whereas it will correspond to a maximum voltage if the voltage is measured directly at the antenna.

Other resonance frequency determination methods are also possible, e.g. via current, voltage, or other demodulation techniques, like IQ demodulation.

According to a further embodiment, the resonance frequency determining circuitry is configured to determine the resonance frequency with the NFC device having an unloaded antenna.

In other embodiments, the steps of determining the resonance frequency may be performed with the NFC device having a loaded antenna.

It should be noted that exemplary embodiments have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is also disclosed with this document.

The aspects defined above and further aspects of the present disclosure will be apparent from the examples of embodiment to be described hereinafter and are explained with reference to the examples of embodiment. Aspects of the present disclosure will be described in more detail hereinafter with reference to examples of embodiment to which the present disclosure is, however, not limited.

DETAILED DESCRIPTION

Figure 1:
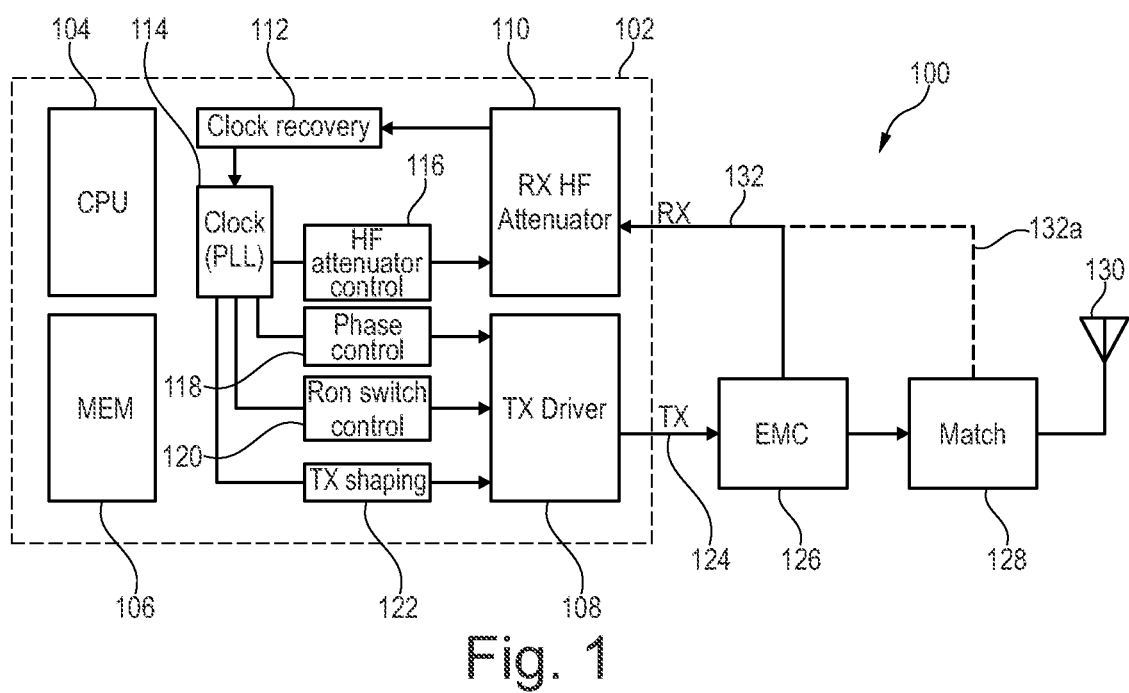
FIG. 1 shows a block diagram of an NFC device according to an exemplary embodiment.

The illustration in the drawing is schematic.

FIG. 1 shows a block diagram of an NFC device 100 according to an exemplary embodiment. The NFC device 100 includes an NFC controller 102, electromagnetic compatibility (EMC) network 126, matching network 128, and antenna 130. The NFC controller 102 may be formed on an integrated circuit (IC) separate from EMC network 126, matching network 128, and antenna 130. For example, NFC device 100 may have EMC network 126, matching network 128, and antenna 130 formed on a printed circuit board (PCB) while NFC controller 102 may be mounted on the PCB as a separately packaged IC. NFC controller 102 includes central processing unit (CPU) 104, memory 106, a transmitter (TX) driver circuit 108, a receiver (RX) circuit 110 that includes a high frequency (HF) attenuator, among other circuits (not shown), a clock recovery circuit 112, a phase-locked loop (PLL) circuit 114, a HF attenuator control circuit 116, a phase control circuit 118, a RON switch control circuit 120, and a TX shaping circuit 122. NFC controller 102 may include other functional blocks and circuits.

Processor 104 may be any type of processor, including circuits for processing, computing, etc., such as a microprocessor (MPU), microcontroller (MCU), digital signal processor (DSP), finite state machine (FSM), and the like. Processor 104 may be configured to execute instructions in order to carry out designated tasks. Memory 106 may include any suitable type of memory array, such as a non-volatile memory (NVM), static random-access memory (SRAM), or others. Memory 106 may be coupled to processor 104 by way of a system bus (not shown). Memory 106 may also be coupled directly or tightly to processor 104. NFC controller 102 may include multiple memories like memory 106 or a combination of different memory types.

For example, memory 106 may include a flash memory array in addition to a separate SRAM array.

An output signal line 124 couples the TX driver circuit 108 with the EMC network 126. The EMC network 126 is coupled with the RX circuit 110 by way of a receive signal line 132. Matching network 128 is coupled between the EMC network 126 and antenna 130. Optionally, the matching network 128 may be coupled with the RX circuit 110 by way of additional signal line 132*a*. In operation, a transmit signal is output from the TX driver circuit 108 based on the phase and clock frequency provided by way of a clock generation circuit and phase adjustment circuit (not shown). The transmit signal is propagated through the EMC network 126 and matching network 128 and transmitted at antenna 130. The TX driver circuit 108 is typically a push/pull driver stage with the possibility to program the output RON resistance. In operation, the RX circuit 110 serves to maintain a constant signal level by way of adjusting impedance.

The clock recovery circuit extracts the clock signal out of the reader field over the antenna 130 and a corresponding clock signal is then provided by the PLL circuit 114 during the modulation and transmission phases. To that end, the HF attenuator control circuit 116, phase control circuit 118, Ron switch control circuit 120, and TX shaping circuit 122 all receive the clock signal from the PLL 114. To compensate for influence of component spread in the matching network 128, the clock recovery circuit 112 and PLL circuit generate a PLL sweep from 12 to 16 MHz (e.g., in 50 kHz steps) and the receiver circuit 110 detects a receiver voltage minimum (or maximum) at a specific resonance frequency. This is advantageously done with the help of the HF attenuator (circuitry to optimize receiver input signal for further signal processing), which is a part of the receiver circuit 110. This resonance frequency is the indicator for the shift of the resonance frequency from the nominal resonance frequency of the board and is be used as input for the adaptation of phase and/or Ron values and/or TX shapes by circuits 118, 120, 122. The method is also applicable for the detection of voltage maxima, e.g., in case the receiver voltage is derived directly from the antenna 130 via the optional connection 132*a*. By controlling the phase control circuit 118, Ron switch control circuit 120, and TX shaping circuit 122 in dependency on the determined resonance frequency, it can be assured that the clock synchronization window is sufficiently wide to allow for effective clock recovery, even in cases where the resonance frequency deviates significantly from the nominal value. This will be discussed in more detail further below.

Figure 2:
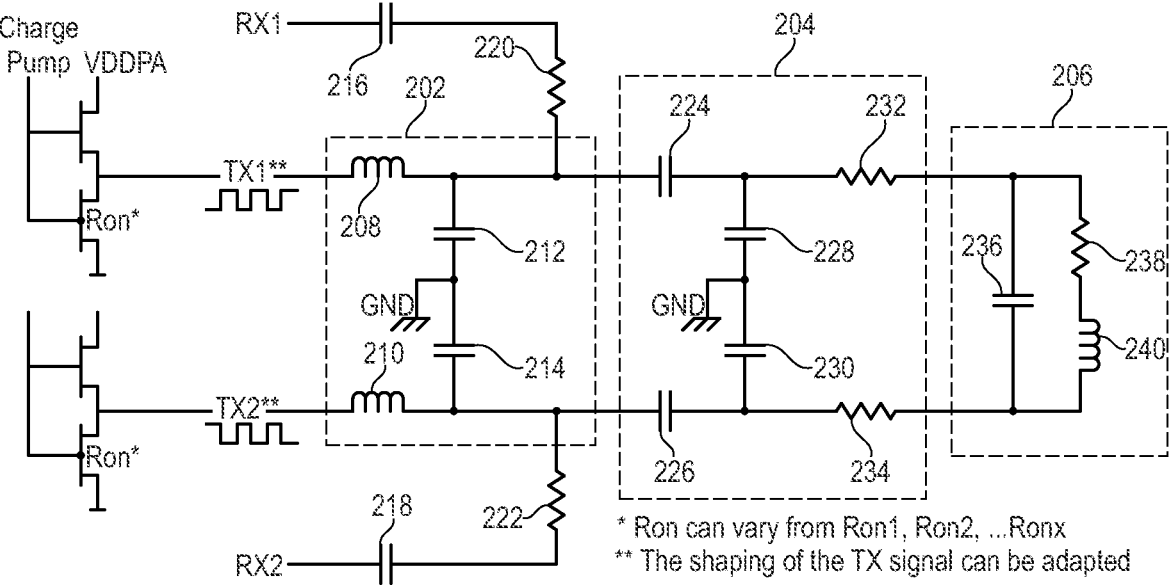
FIG. 2 shows a circuit diagram of an exemplary transceiver.

FIG. 2 shows a circuit diagram or simulation model 200 of an exemplary transceiver, as described in U.S. Pat. Nos. 10,237,000 B1 and 11,005,534 B2. In particular, an example simulation model 200 is shown, which includes an example EMC network model 202, an example matching network model 204, and example antenna model 206. Simulation model 200 depicts a differential transmit signaling path having terminals labeled TX1 and TX2. As described elsewhere in this document, the shaping of the TX signal can be adapted in various embodiments of the present disclosure. Likewise, differential receive signaling path is depicted having terminals RX1 and RX2. Single-ended signaling paths may be employed for transmit and/or receive signals. Here, the EMC network model 202 corresponds to the EMC network 126 of FIG. 1 where terminals TX1 and TX2 are coupled to the TX driver circuit 108 and terminals RX1 and RX2 are coupled to the RX circuit 110. Accordingly, matching network model 204 corresponds to matching network 128 and antenna model 206 corresponds to antenna 130.

The EMC network model 202 includes inductors 208, 210 and capacitors 212, 214. A first terminal of inductor 208 is coupled at input terminal TX1 and a second terminal of inductor 208 is coupled to a first terminal of capacitor 212 at a first node. A second terminal of capacitor 212 is coupled to ground voltage supply terminal labeled GND. A first terminal of inductor 210 is coupled at input terminal TX2 and a second terminal of inductor 210 is coupled to a first terminal of capacitor 214 at a second node. A second terminal of capacitor 214 is coupled to the GND supply terminal. The EMC network model 202 may include other components. Furthermore, the EMC network model 202 may be formed in a single-ended configuration.

Receive signaling path includes capacitors 216, 218 and resistors 220, 222. A first terminal of capacitor 216 is coupled at terminal RX1 and a second terminal of capacitor 216 is coupled to a first terminal of resistor 220. A second terminal of resistor 220 is coupled at the first node. A first terminal of capacitor 218 is coupled at terminal RX2 and a second terminal of capacitor 218 is coupled to a first terminal of resistor 222. A second terminal of resistor 222 is coupled at the second node. The receive signaling path may be formed in a single-ended configuration (e.g., capacitor 216, resistor 220 path).

The matching network model 204 includes capacitors 224-230 and resistors 232, 234. A first terminal of capacitor 224 is coupled to the EMC network model 202 at the first node and a second terminal of capacitor 224 is coupled to a first terminal of capacitor 228 at a third node. A second terminal of capacitor 228 is coupled to GND supply terminal. A first terminal of capacitor 226 is coupled to the EMC network model 202 at the second node and a second terminal of capacitor 226 is coupled to a first terminal of capacitor 230 at a fourth node. A second terminal of capacitor 230 is coupled to the GND supply terminal. A first terminal of resistor 232 is coupled at the third node and a second terminal of resistor 232 is coupled to the antenna model at a fifth node. A first terminal of resistor 234 is coupled at the fourth node and a second terminal of resistor 234 is coupled to the antenna model at a sixth node. The matching network model 204 may include other and/or less components as well.

The antenna model 206 includes capacitor 236, resistor 238, and inductor 240. A first terminal of capacitor 236 is coupled at the fifth node and a second terminal of capacitor 236 is coupled at the sixth node. A first terminal of resistor 238 is coupled at the fifth node and a second terminal of resistor 238 is coupled to a first terminal of inductor 240. A second terminal of inductor 240 is coupled at the sixth node. The antenna model 206 may include other components as well.

Figure 3:
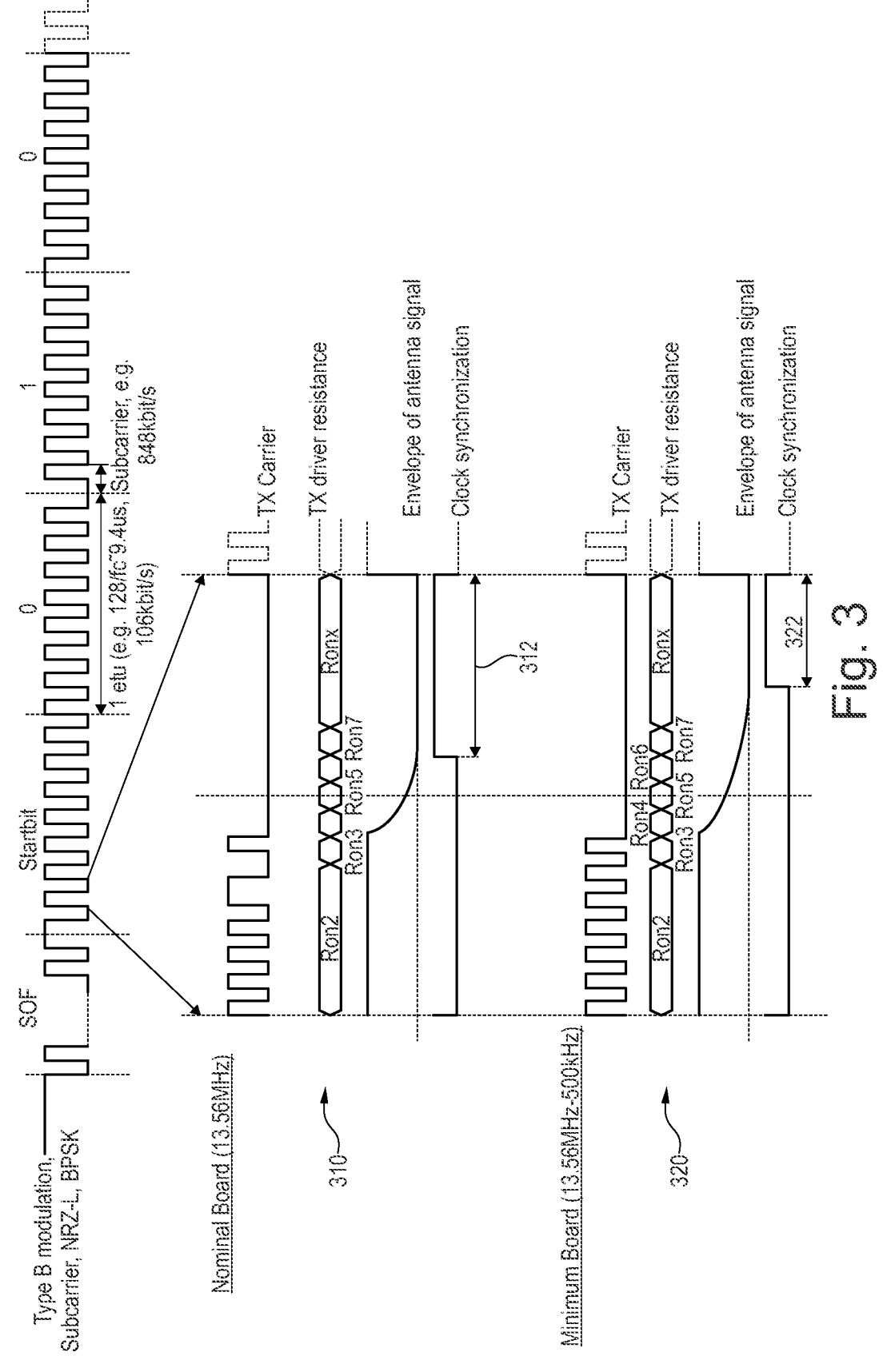
FIG. 3 illustrates the impact of matching network variations on the clock synchronization window in a prior art system.

FIG. 3 illustrates the impact of matching network variations on the clock synchronization window in a prior art system. More specifically, the plot 310 shows TX carrier, TX driver resistance, the envelope of the antenna signal, and a clock synchronization window 312 for an NFC device during a modulation phase where the resonance frequency of the matching network equals the nominal value, i.e., 13.56 MHz. In this case, the clock synchronization window 312 is sufficiently wide for the clock recovery to be successful. The plot 320 shows similar data for an NFC device where the resonance frequency of the matching network is 500 kHz lower than the nominal value, i.e., the resonance frequency is 13.56 MHz-500 kHz=13.06 MHz. In this case, the clock synchronization window 322 is significantly smaller or shorter than the clock synchronization window 312 in the nominal case 310, and therefore, the clock recovery will not be successful.

Figure 4:
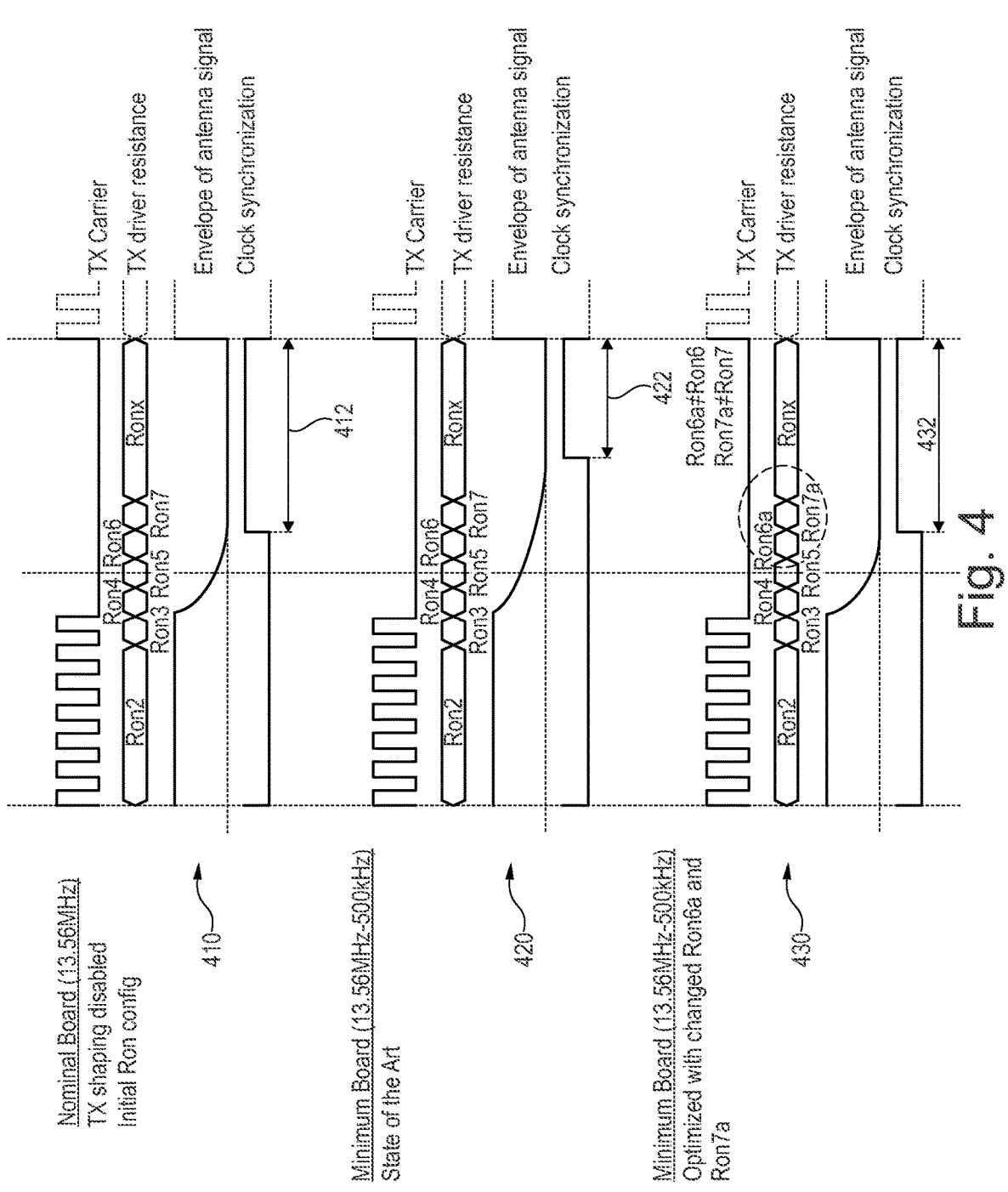
FIG. 4 illustrates the improvement provided by one exemplary embodiment.

FIG. 4 illustrates the improvement provided by one exemplary embodiment. The plots 410 and 420 are similar to plots 310 and 320 in FIG. 3 and illustrate the difference in the length or width of the clock synchronization windows 412 and 422 in the case of the matching network having nominal (13.56 MHz) or significantly lower (13.06 MHz) resonance frequency, respectively. The plot 430 shows how adaptation of at least some of the TX driver resistance values in dependency on the measured resonance frequency can widen the clock synchronization window 432 sufficiently to provide a successful clock recovery. More specifically, the TX driver resistance values Ron6 and Ron7 are replaced by TX driver resistance values Ron6a and Ron7a such that the dampening of the antenna signal is improved. As shown, this results in a clock synchronization window 432 that is comparable to the clock synchronization window 412 in the nominal case 410. In this example, Ron6a and Ron7a may be about 0.5 Ohm larger than Ron6 and Ron7, which may respectively be around 1.5 Ohm while Ron1 to Ron5 are around 1 Ohm. If the resonance frequency is instead 500 MHz above nominal, i.e. 14.06 MHz, Ron6a and Ron7a may instead be about 0.5 Ohm smaller than Ron6 and Ron7, respectively.

Figure 5:
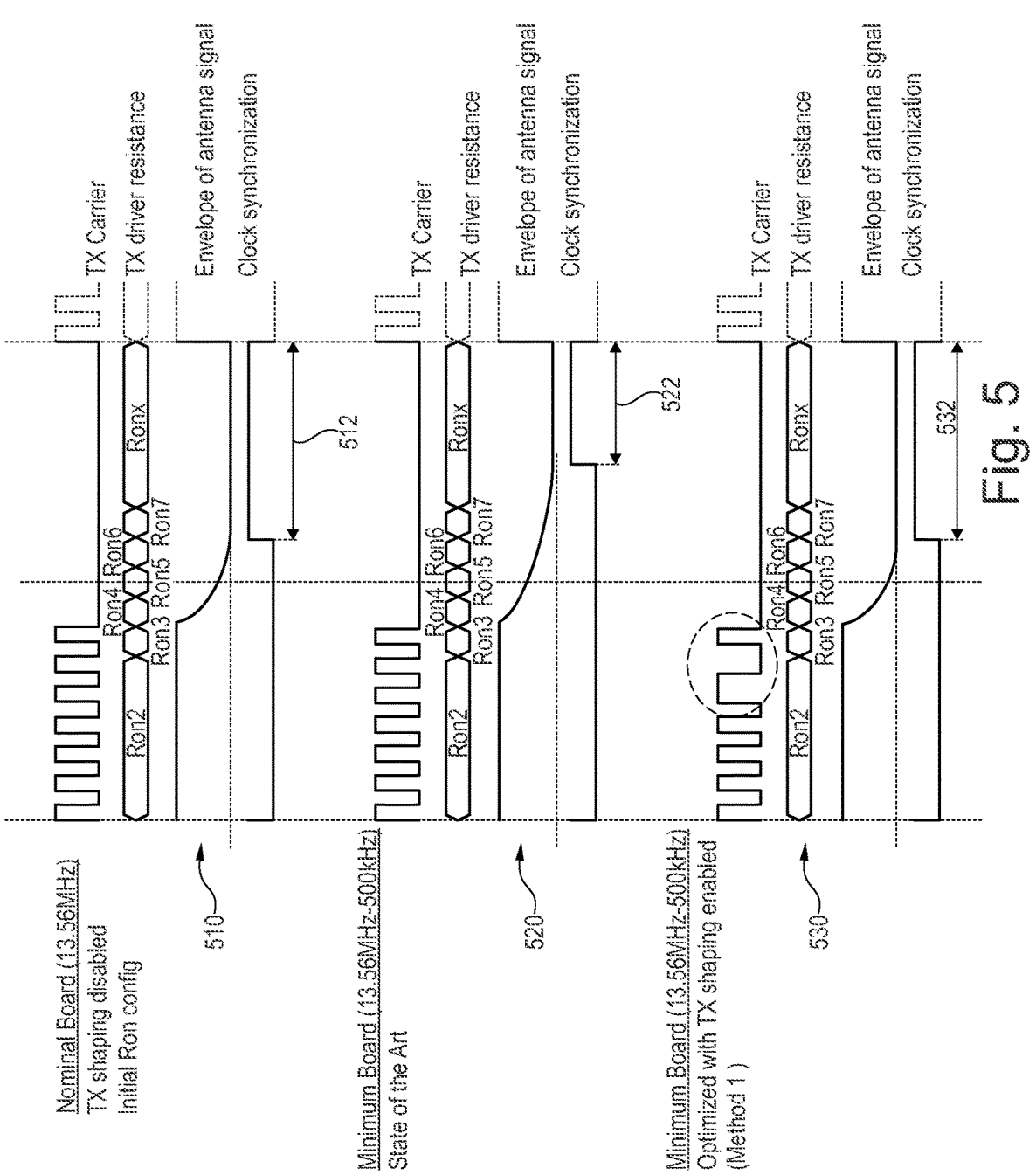
FIG. 5 illustrates the improvement provided by another exemplary embodiment.

FIG. 5 illustrates the improvement provided by another exemplary embodiment. Again, the plots 510 and 520 are similar to plots 310 and 320 in FIG. 3 and illustrate the difference in the length or width of the clock synchronization windows 512 and 522 in the case of the matching network having nominal (13.56 MHz) or significantly lower (13.06 MHz) resonance frequency, respectively. The plot 530 shows how enabling a TX shaping function (TX shaping method 1) in dependency on the measured resonance frequency can widen the clock synchronization window 532 sufficiently to provide a successful clock recovery. As shown, the TX shaping indicated by the dashed circle results in a clock synchronization window 532 that is comparable to the clock synchronization window 512 in the nominal case 510.

Figure 6:
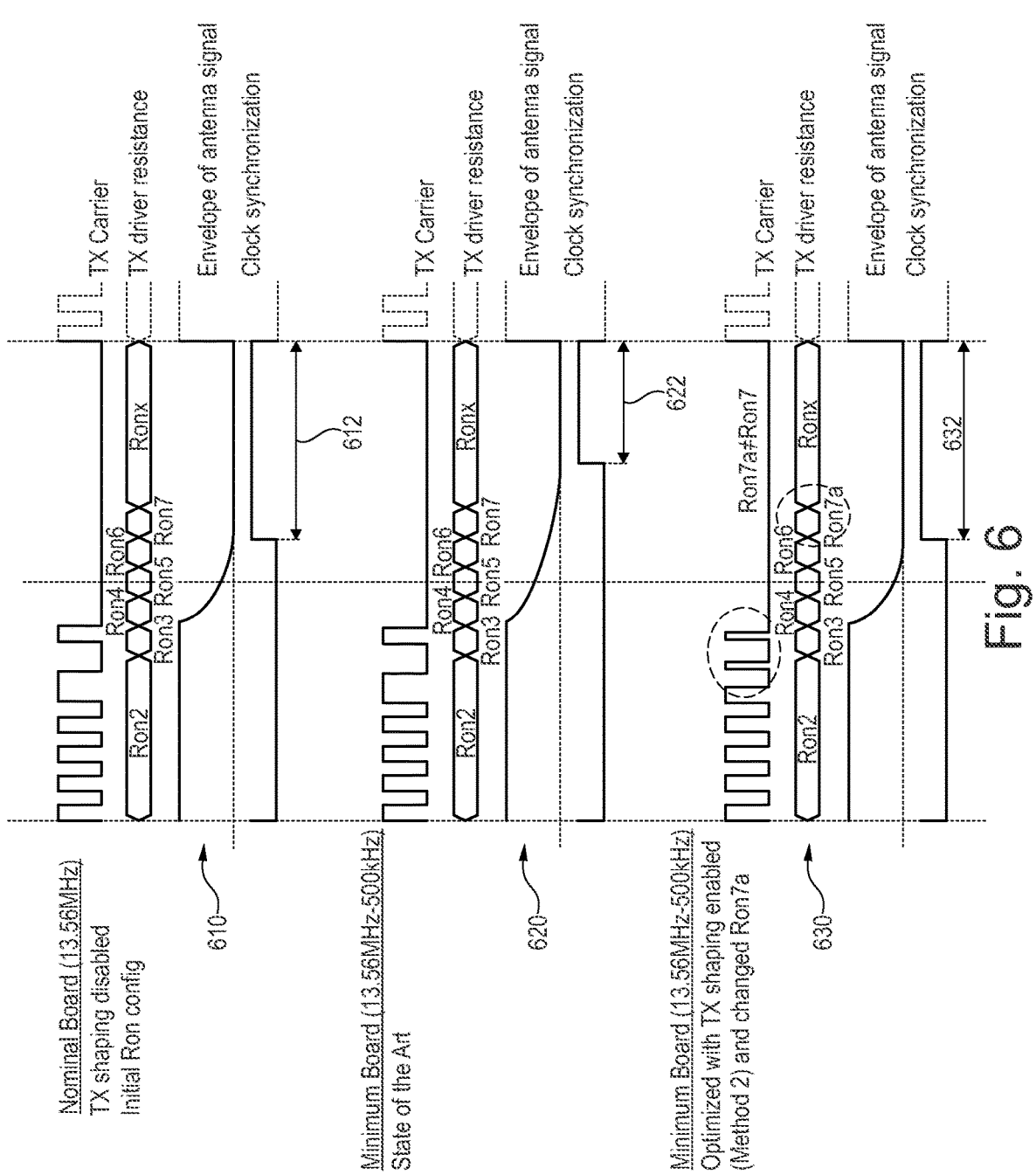
FIG. 6 illustrates the improvement provided by yet another exemplary embodiment.

FIG. 6 illustrates the improvement provided by yet another exemplary embodiment. Again, the plots 610 and 620 are similar to plots 310 and 320 in FIG. 3 and illustrate the difference in the length or width of the clock synchronization windows 612 and 622 in the case of the matching network having nominal (13.56 MHz) or significantly lower (13.06 MHz) resonance frequency, respectively. The plot 430 shows how adaptation of at least some of the TX driver resistance values and enabling a TX shaping function (TX shaping method 2) in dependency on the measured resonance frequency can widen the clock synchronization window 632 sufficiently to provide a successful clock recovery. More specifically, the TX driver resistance value Ron7 is replaced by TX driver resistance value Ron7a (Ron7a≈Ron7+0.5 Ohm) and TX shaping method 2 is enabled. As shown, the adjusted TX driver resistance value and the TX shaping indicated by the dashed circle results in a clock synchronization window 632 that is comparable to the clock synchronization window 612 in the nominal case 610.

Figure 7:
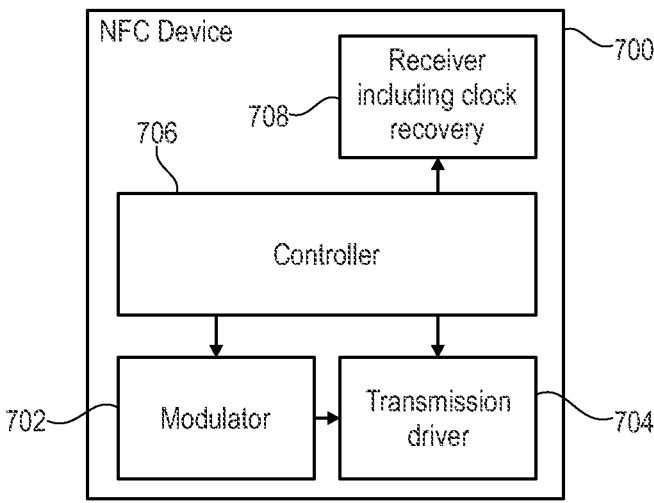
FIG. 7 shows a block diagram of an NFC device according to an exemplary embodiment.

FIG. 7 shows a block diagram of an NFC device 700 according to an exemplary embodiment. The NFC device 700 comprises a modulator 702, a transmission driver 704 and a controller 706. The modulator 702 is configured to modulate an unmodulated carrier signal received from an external reader (not shown), which results in a modulated carrier signal. The controller 706 is configured to control a transmission of the modulated carrier signal to the external reader. Furthermore, the transmitter driver 704 is configured to drive said transmission (i.e., to transmit the modulated carrier signal to the external reader). The transmitter driver 704 has a variable resistance. For instance, the transmission driver may have a variable on-state resistance $R_{ON}$. In accordance with the present disclosure, the controller 706 is configured to change the variable resistance during a modulation phase of the NFC device 400 in dependency on the resonance frequency of the matching network (not shown). In other words, the variable resistance may be changed at any time during an entire frame. Furthermore, the controller 706 is configured to enable TX shaping methods in dependency on the resonance frequency of the matching network (not shown). Yet further, the controller 706 is configured to adjust the phase of the transmitted modulated carrier signal in dependency on the resonance frequency of the matching network (not shown). In this way, by applying one or more of TX driver resistance adjustments, TX shaping, and phase adjustment, the damping of the transmitted signal can be improved, such that the synchronization window is widened also in cases where the resonance frequency of the matching network deviates significantly from the nominal value, e.g., due to component variations. Thus, a proper clock synchronization is possible even in cases where the components of the matching network exhibit significantly spreading. It is noted that, although the modulator 702, transmission driver 704 and controller 706 are shown as separate components, the skilled person will appreciate that one or more these components may be integrated into a single component. Furthermore, one or more these components may be embedded in another component. For example, the transmission driver 704 may be embedded in the controller 706. Furthermore, the NFC device 700 comprises a receiver 708 which is configured to receive the carrier signal from the external reader. The receiver 708 includes a clock recovery unit configured to recover a clock.

Figure 8:
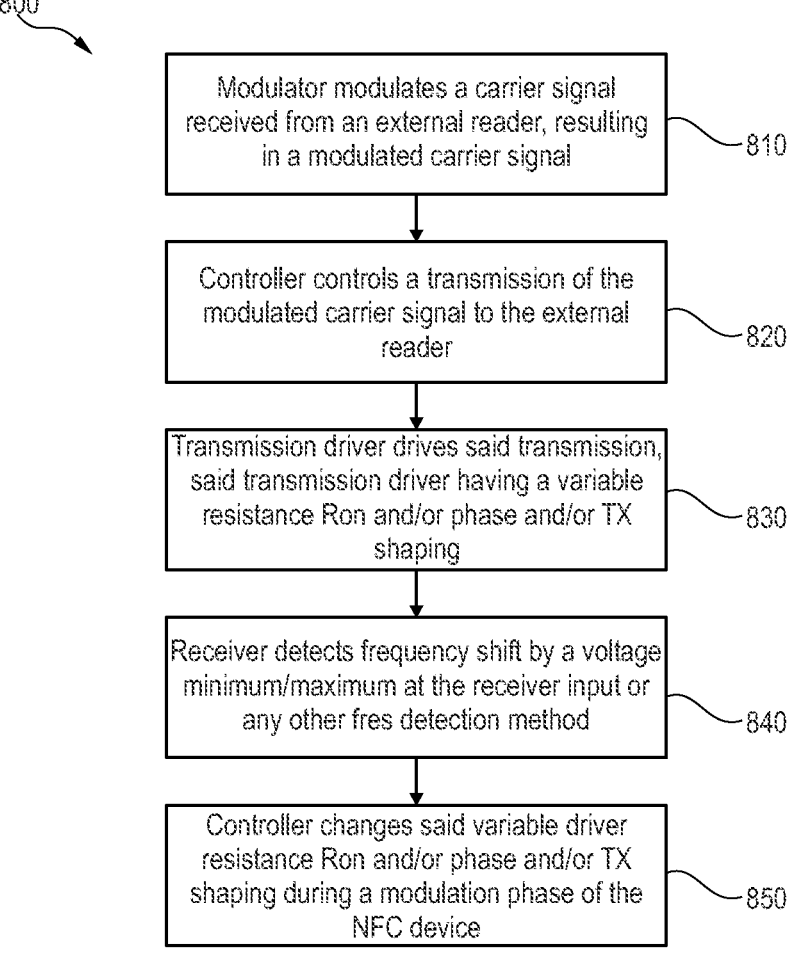
FIG. 8 shows a flowchart of a method of operating an NFC device in accordance with an exemplary embodiment.

FIG. 8 shows a flowchart 800 of a method of operating an NFC device in accordance with an exemplary embodiment. The method 800 includes the following steps. At 810, the modulator modulates a carrier signal received from an external reader, which results in a modulated carrier signal. At 820, the controller controls a transmission of the modulated carrier signal to the external reader. Furthermore, at 830, the transmission driver transmits said modulated carrier signal, the transmission driver having a variable resistance and/or phase and/or TX shaping. At 840, the receiver detects resonance frequency shift by a voltage minimum/maximum at the receiver input or any other suitable method of detecting resonance frequency. Furthermore, at 850, the controller changes the variable resistance and/or phase and/or TX shaping during a modulation phase of the NFC device. Some or all of the steps of method 800 may be carried out simultaneously. By changing the variable resistance and/or phase and/or TX shaping during the modulation phase, the damping of the transmitted signal can be improved, such that the synchronization window is widened sufficiently to enable successful clock recovery. Consequently, a proper clock synchronization is possible when using components with significant spread in the matching network.

It is noted that, unless otherwise indicated, the use of terms such as "upper", "lower", "left", and "right" refers solely to the orientation of the corresponding drawing.

It is noted that the term "comprising" does not exclude other elements or steps and that the use of the articles "a" or "an" does not exclude a plurality. Also, elements described in association with different embodiments may be combined. It should also be noted that reference signs in the claims should not be construed as limiting the scope of the claims.

The invention claimed is:

1. A method of operating an NFC device, the method comprising:
    determining a resonance frequency of a matching network of the NFC device,
    wherein determining the resonance frequency includes:
        sweeping a transmitter clock frequency over a predetermined frequency range,
        identifying a frequency value within the predetermined frequency range at which a voltage at a receiver circuit of the NFC device has a minimum value or a maximum value, and
        using the identified frequency value as the resonance frequency;
    modulating, by a modulator, a carrier signal received from an external reader, resulting in a modulated carrier signal;
    controlling, using a controller, a transmission of the modulated carrier signal to the external reader; and
    transmitting, by a transmitter driver, said modulated carrier signal, said transmitter driver having at least one configurable setting that influences a damping behavior of the transmitted modulated carrier signal,
    wherein, during a modulation phase of the NFC device, the controller selects and applies the at least one configurable setting based on the determined resonance frequency such that a clock synchronization window is widened.

2. The method according to claim 1, wherein the at least one configurable setting is associated with a variable resistance of the transmitter driver.

3. The method according to claim 1, wherein the at least one configurable setting comprises a sequence of different resistances to be applied during different parts of the modulation phase of the NFC device.

4. The method according to claim 1, wherein the at least one configurable setting comprises a phase of the transmitted modulated carrier signal.

5. The method according to claim 1, wherein the at least one configurable setting comprises a TX shaping functionality to be applied during the modulation phase of the NFC device.

6. The method according to claim 5, wherein the TX shaping functionality is selected from a group consisting of no TX shaping and at least one predetermined TX shaping method.

7. The method according to claim 1, wherein the controller selects the at least one configurable setting from a plurality of predetermined settings, each of the predetermined settings corresponding to a particular resonance frequency value.

8. The method according to claim 7, wherein the controller selects the at least one configurable setting by applying interpolation to at least two predetermined settings of the plurality of predetermined settings.

9. The method according to claim 1, wherein the determining is performed with the NFC device having an unloaded antenna.

10. The method according to claim 1, wherein the determining is performed with the NFC device having a loaded antenna.

11. An NFC device, the device comprising:

a resonance frequency determining circuitry configured to sweep a transmitter clock frequency over a predetermined frequency range, identify a frequency value within the predetermined frequency range at which a voltage at a receiver circuit of the NFC device has a minimum value or a maximum value, and use the identified frequency value as a resonance frequency of a matching network of the NFC device;

a modulator configured to modulate a carrier signal received from an external reader, resulting in a modulated carrier signal;

a controller configured to control a transmission of the modulated carrier signal to the external reader; and a transmitter driver configured to transmit said modulated carrier signal, said transmitter driver having at least one configurable setting that influences a damping behavior of the transmitted modulated carrier signal, wherein the controller is further configured to select and apply the at least one configurable setting based on the determined resonance frequency such that a clock synchronization window is widened.

12. The device according to claim 11, wherein the at least one configurable setting is associated with a variable resistance of the transmitter driver.

13. The device according to claim 11, wherein the at least one configurable setting comprises a sequence of different resistances to be applied during different parts of the modulation phase of the NFC device.

14. The device according to claim 11, wherein the at least one configurable setting comprises a phase of the transmitted modulated carrier signal.

15. The device according to claim 11, wherein the at least one configurable setting comprises a TX shaping functionality to be applied during the modulation phase of the NFC device.

16. The device according to claim 15, wherein the TX shaping functionality is selected from a group consisting of no TX shaping and at least one predetermined TX shaping method.

17. He device according to claim 11, wherein the controller selects the at least one configurable setting from a plurality of predetermined settings, each of the predetermined settings corresponding to a particular resonance frequency value.

18. The device according to claim 17, wherein the controller selects the at least one configurable setting by applying interpolation to at least two predetermined settings of the plurality of predetermined settings.

19. The device according to claim 11, wherein the resonance frequency determining circuitry is configured to determine the resonance frequency with the NFC device having an unloaded antenna.

20. The device according to claim 11, wherein the resonance frequency determining circuitry is configured to determine the resonance frequency with the NFC device having a loaded antenna.

* * * * *